(12) United States Patent
Lai et al.

(10) Patent No.: US 10,720,095 B2
(45) Date of Patent: Jul. 21, 2020

(54) METHOD OF POTENTIAL REGULATION OF DISPLAY PANEL, POTENTIAL REGULATION SYSTEM AND STORAGE APPARATUS

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Ching-hong Lai, Guangdong (CN); Shen-sian Syu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 30 days.

(21) Appl. No.: 15/741,061

(22) PCT Filed: Dec. 20, 2017

(86) PCT No.: PCT/CN2017/117353
§ 371 (c)(1),
(2) Date: Sep. 27, 2018

(87) PCT Pub. No.: WO2019/090913
PCT Pub. Date: May 16, 2019

(65) Prior Publication Data
US 2019/0139482 A1 May 9, 2019

(30) Foreign Application Priority Data
Nov. 7, 2017 (CN) .......................... 2017 1 1090450

(51) Int. Cl.
*G09G 3/22* (2006.01)
*G01R 19/165* (2006.01)
*G05F 1/10* (2006.01)

(52) U.S. Cl.
CPC ........... *G09G 3/22* (2013.01); *G01R 19/1659* (2013.01); *G05F 1/10* (2013.01);
(Continued)

(58) Field of Classification Search
CPC . G01R 19/16533; G01R 19/1659; G05F 1/10; G09G 2310/0264; G09G 2320/029;
(Continued)

(56) References Cited

U.S. PATENT DOCUMENTS

| 2007/0086078 | A1* | 4/2007 | Hagood | G09G 3/3433 359/298 |
| 2008/0174532 | A1* | 7/2008 | Lewis | G09G 3/3433 345/85 |

(Continued)

FOREIGN PATENT DOCUMENTS

| CN | 102110421 A | 6/2011 |
| CN | 106128358 A | 11/2016 |
| CN | 207352939 U | 5/2018 |

*Primary Examiner* — Tony O Davis
(74) *Attorney, Agent, or Firm* — Hemisphere Law, PLLC; Zhigang Ma

(57) ABSTRACT

A method of potential regulation of display panel, a potential regulation system and a storage apparatus are provided. The method comprising: obtaining a display bias value $\Delta V_{th}$ of the display panel; calculating an outputting voltage value $V_t = V_i + \Delta V_{th}$ which currently needs according a currently inputting voltage value $V_i$ and the display bias value $\Delta V_{th}$; determining whether the currently inputting voltage value $V_i$ is in regulation range of the potential regulator; if yes, controlling the potential regulator to output correspondingly regulation voltage value according to the outputting voltage value $V_t$; if no, regulating the regulation range of the
(Continued)

potential regulator according to the outputting voltage value $V_r$. Therefore, it could efficiency improve the problem of potential deviation in the display panel.

8 Claims, 2 Drawing Sheets

(52) U.S. Cl.
CPC ............ *G01R 19/16533* (2013.01); *G09G 2310/0264* (2013.01); *G09G 2320/029* (2013.01)

(58) Field of Classification Search
CPC ..... G09G 2320/0295; G09G 2320/045; G09G 2330/02; G09G 3/22; G09G 3/30; G09G 3/3208
USPC .......................................................... 345/85
See application file for complete search history.

(56) References Cited

U.S. PATENT DOCUMENTS

| | | | |
|---|---|---|---|
| 2014/0176098 A1* | 6/2014 | Fang | G05F 1/46 |
| | | | 323/280 |
| 2015/0187264 A1 | 7/2015 | Pyo | |
| 2016/0314755 A1* | 10/2016 | Feng | G09G 3/3655 |
| 2017/0061860 A1* | 3/2017 | Park | G09G 3/3648 |
| 2017/0193909 A1* | 7/2017 | Song | G09G 3/2074 |
| 2018/0204514 A1 | 7/2018 | Xu et al. | |
| 2018/0277057 A1* | 9/2018 | Yamada | G09G 5/02 |
| 2018/0322827 A1* | 11/2018 | Zhang | G09G 3/3241 |
| 2018/0322839 A1* | 11/2018 | Chen | G09G 3/3655 |
| 2019/0088201 A1* | 3/2019 | Zhao | G09G 3/3696 |
| 2019/0088202 A1* | 3/2019 | Zhao | G09G 3/3258 |
| 2019/0088231 A1* | 3/2019 | Zhao | G09G 3/3696 |
| 2019/0101947 A1* | 4/2019 | Mercier | G01K 7/01 |
| 2019/0251924 A1* | 8/2019 | Fu | G02F 1/136286 |

* cited by examiner

METHOD OF POTENTIAL REGULATION OF DISPLAY PANEL, POTENTIAL REGULATION SYSTEM AND STORAGE APPARATUS

RELATED APPLICATIONS

The present application is a National Phase of International Application Number PCT/CN2017/117353, filed Dec. 20, 2017, and claims the priority of China Application 201711090450.4, filed Nov. 7, 2017.

FIELD OF THE DISCLOSURE

The disclosure relates to a display technical field, and more particularly to a method of potential regulation of display panel, a potential regulation system and a storage apparatus.

BACKGROUND

The existing display panels usually will setting outputting voltage after manufacturing, and it let the display panel could achieve to a certain brightness when outputting a certain voltage. However, the actual output voltage of the display panel usually will larger or smaller than the correspondingly setting voltage—which is potential deviation, such that affect the display effect. In order to solve this problem, in the present the technology is for detecting potential of display panel by potential detecting IC, and then comparing the detecting potential and the needs potential of normal display, if these two potentials are difference, inputting the correspondingly potential compensation value for regulating the display panel. It collude ensure display effect of display panel. However, if the potential deviation of display panel is more than the regulation range of the display panel, it could not provide a effectively compensation regulating.

SUMMARY

A technical problem to be solved by the disclosure is to provide a method of potential regulation of display panel, a potential regulation system and a storage apparatus, it could solve the problem about when potential deviation is over the regulation range of display panel, and it cannot efficiency compensation regulating display panel.

An objective of the disclosure is achieved by following embodiments. In particular, a method of potential regulation of display panel, the display panel comprises a potential regulator for regulating display voltage of the display panel, the method comprising: obtaining a display bias value $\Delta V_{th}$ of the display panel; calculating an outputting voltage value $V_t=V_i+\Delta V_{th}$ which needs currently according a currently inputting voltage value $V_i$ and the display bias value $\Delta V_{th}$; determining whether the currently inputting voltage value $V_i$ is in regulation range of the potential regulator; if yes, controlling the potential regulator to output correspondingly regulation voltage value according to the outputting voltage value $V_t$; if no, regulating the regulation range of the potential regulator according to the outputting voltage value $V_t$.

According to another aspect of the disclosure, the disclosure further provides a potential regulation system of display panel. The potential regulation system of display panel, the potential regulation system comprising a potential sensor, a controller and a potential regulator coupled to each other, wherein: the potential sensor obtaining a display bias value $\Delta V_{th}$ of the display panel; the controller calculating an outputting voltage value $V_t=V_i+\Delta V_{th}$ which needs currently according a currently inputting voltage value $V_i$ and the display bias value $\Delta V_{th}$, and determining whether the currently inputting voltage value $V_i$ is in regulation range of the potential regulator; if yes, the controller controlling the potential regulator to output correspondingly regulation voltage value according to the outputting voltage value $V_t$; if no, the controller regulating the regulation range of the potential regulator according to the outputting voltage value $V_t$.

According to yet aspect of the disclosure, the disclosure further provides a storage apparatus, the storage apparatus for storage program data, the storage program data could be executed to achieve method of potential regulation of display panel, the display panel comprising a potential regulator for regulating display voltage of display panel, wherein the method of potential regulation comprising: obtaining a display bias value $\Delta V_{th}$ of the display panel; calculating an outputting voltage value $V_t=V_i+\Delta V_{th}$ which needs currently according a currently inputting voltage value $V_i$ and the display bias value $\Delta V_{th}$; determining whether the currently inputting voltage value $V_i$ is in regulation range of the potential regulator; if yes, controlling the potential regulator to output correspondingly regulation voltage value according to the outputting voltage value $V_t$; if no, regulating the regulation range of the potential regulator according to the outputting voltage value $V_t$.

In sum, the advantageous is that: comparing to the existing technology, the present invention provides a method of potential regulation of display panel, a potential regulation system and a storage apparatus. Wherein, obtaining a display bias value $\Delta V_{th}$ of the display panel; calculating an outputting voltage value $V_t=V_i+\Delta V_{th}$ which needs currently according a currently inputting voltage value $V_i$ and the display bias value $\Delta V_{th}$, determining whether the currently inputting voltage value $V_i$ is in regulation range of the potential regulator; if yes, controlling the potential regulator to output correspondingly regulation voltage value according to the outputting voltage value $V_t$; if no, regulating the regulation range of the potential regulator according to the outputting voltage value $V_t$. According to the invention above, when the display panel has potential deviation problem, and outputting voltage which after compensation is over than regulation range of the potential regulator, it could change regulation range of the potential regulator for changing the regulation range of outputting voltage of the potential regulator. Therefore, it could effectively improve the display poor quality due to the potential deviation.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The disclosure will be further described in detail with reference to accompanying drawings and preferred embodiments as follows.

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
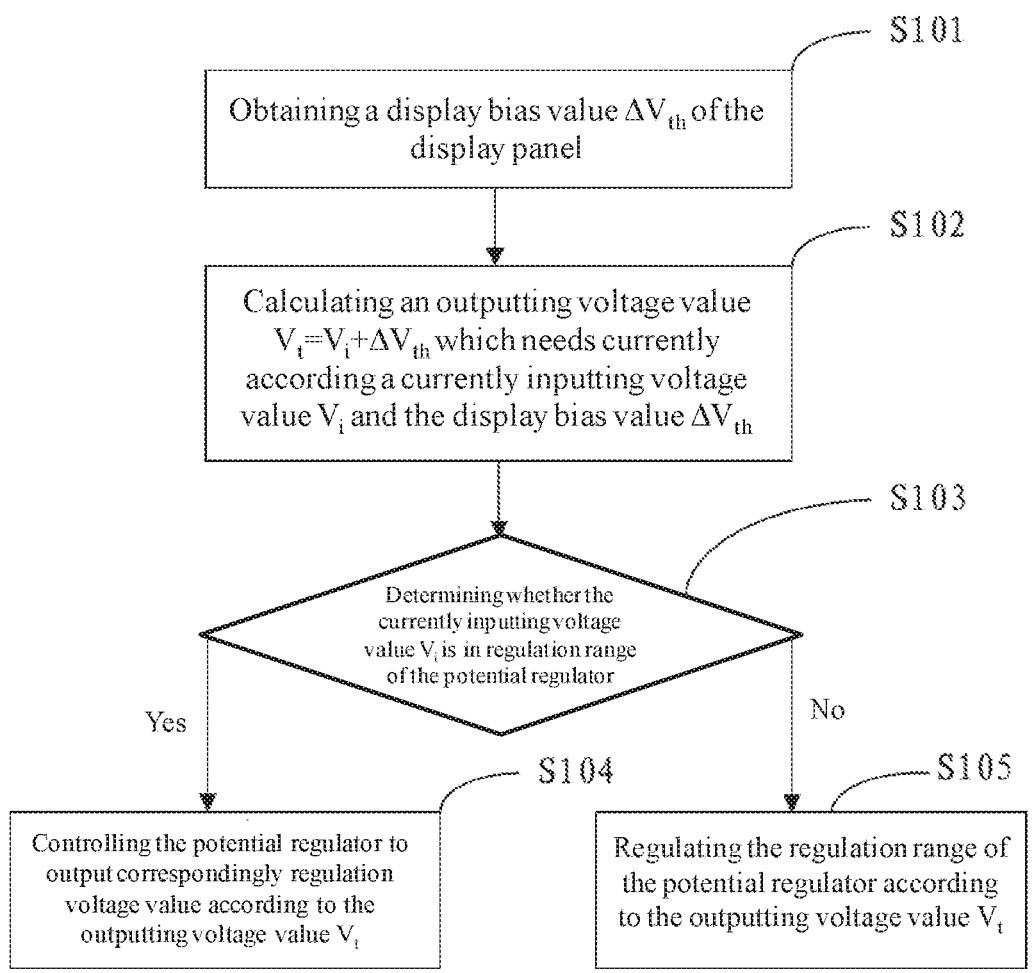
FIG. 1 is a flowchart schematic view of a method of potential regulation of display panel according to an embodiment of the disclosure.

Please refer to FIG. 1. FIG. 1 is a flowchart schematic view of a method of potential regulation of display panel according to an embodiment of the disclosure. The method of potential regulation in the present invention is use for solve the problem of electric potential shift for display panel. The specifically method of potential regulation comprising following steps:

Step S101: obtaining a display bias value $\Delta V_{th}$ of the display panel.

The step of "obtaining a display bias value $\Delta V_{th}$ of the display panel" indicates to obtain the difference between the theoretical output voltage and the actual output voltage when the display panel outputs a certain voltage. Wherein, $\Delta V_{th}$ is the theoretical output voltage minus the actual output voltage. If $\Delta V_{th}$ is less than 0, which means the theoretical output voltage value is less than the actual output voltage value, at this time the potential deviation is positive excursion. Similarly, if the $\Delta V_{th}$ is more than 0, the potential deviation is negative excursion.

In this step, the actual output voltage is an output voltage in a display brightness of the display panel and sensing from a voltage potential sensor. Wherein the voltage potential sensor could be a potential sensing IC, which sensing the actual output voltage from display panel according to the potential sensing IC electrically connecting to sensing line of the display panel.

Wherein the display bias value $\Delta V_{th}$ is voltage bias value of pixel on the display panel. The display bias value $\Delta V_{th}$ could be the minimum display bias value of all pixels on the display panel, and also could be the minimum display bias value of the each row pixels or the each column pixels on the display panel.

For example, obtaining the minimum display bias value of the each row pixels or the each column pixels on the display panel. The method of obtaining the minimum display bias value, which is obtaining the potential bias value of the each row pixels or the each column pixels by the voltage potential sensor, and comparing all of the obtaining bias values to obtain the minimum display bias value of the each row pixels or the each column pixels.

Similarly, the method of obtaining the minimum display bias value, which is obtaining the potential bias value of all pixels on the display panel by the voltage potential sensor, and comparing all of the obtaining bias values of all pixels to obtain the minimum display bias value.

Step S102: calculating an outputting voltage value $V_t = V_i + \Delta V_{th}$ which needs currently according a currently inputting voltage value $V_i$ and the display bias value $\Delta V_{th}$.

When the display bias value $\Delta V_{th}$ is not equal to 0 in the step S101, the display panel has potential deviation. In order to not affect the display effect of display panel, it needs to provide a compensation value to display panel, wherein the compensation value could be the minimum display bias value of the pixels on the display panel in step S101, and also could be the minimum display bias value of the rows or columns. Therefore, it could obtains the currently needs outputting voltage value $V_t = V_i + \Delta V_{th}$.

Wherein, $V_t$ is a currently needs outputting voltage value, $V_i$ is a currently inputting voltage value.

Step S103, determining whether the currently inputting voltage value $V_i$ is in regulation range of the potential regulator.

According to obtain the currently needs outputting voltage value $V_t$ from the step S102, determining whether the currently needs inputting voltage value $V_t$ is in regulation range of the potential regulator. If yes, enter into the step S104; if no, enter into the step S105. The specifically method of the step S104 and the step S105 as following described.

Step S104, if yes, controlling the potential regulator to output correspondingly regulation voltage value according to the outputting voltage value $V_t$.

If yes, the currently needs outputting voltage value $V_t$ is in regulation range of the potential regulator, the controller controlling the potential regulator outputting voltage $V_t$.

Step S105, if no, regulating the regulation range of the potential regulator according to the outputting voltage value $V_t$.

If no, the currently needs outputting voltage value $V_t$ is exceeds the regulation range of the potential regulator, the potential regulator cannot output voltage $V_t$. Therefore, it needs to regulating the regulation range of the potential regulator let the potential regulator which adjusted the regulation range could output voltage for outputting voltage $V_t$.

According to the above method of this present invention which could regulate the regulation range of the potential regulator. It made the outputting voltage which be compensated of the display panel is in the outputting voltage range of the potential regulator, such that could efficiency improve the problem of potential deviation in the display panel.

Further, the specifically step of regulating the regulation range of the potential regulator according to the potential regulation method above, which comprising:

a. pre-setting a maximum value $V_{GK}$ and a minimum value $V_{GI}$ for regulation voltage of the potential regulator.

There will setting the voltage regulation range for the potential regulator before the display panel be released, in this step, a maximum value $V_{GK}$ and a minimum value $V_{GI}$ as same as a maximum value and a minimum value of the potential regulator which setting before the display panel be released.

b. calculating a correspondingly outputting voltage value $V_{t255} = V_{i255} + \Delta V_{th}$ of a currently maximum gray scale by currently input a voltage value $V_{i255}$ which corresponding to the maximum gray scale and the display bias values $\Delta V_{th}$, and calculating a correspondingly outputting voltage value $V_{t0} = V_{i0} + \Delta V_{th}$ of a currently minimum gray scale by currently input a voltage value $V_{i0}$ which corresponding to the minimum gray scale and the display bias values $\Delta V_{th}$.

In this step selects the maximum gray scale is gray scale 255 and the minimum gray scale is gray scale 0. The voltage value $V_{i255}$ is the outputting voltage value while gray scale 255, $V_{i0}$ is the outputting voltage value while gray scale 0. Selectively, it could also selects at least two others gray scale value and respectively calculating the correspondingly outputting voltage values; and then calculating the respectively correspondingly outputting voltage values of the maximum gray scale is gray scale 255 and the minimum gray scale is gray scale 0 according to linear interpolation.

Wherein, the display bias values $\Delta V_{th}$ could be the minimum voltage bias value of all pixels of the display panel for step S101. Or the minimum voltage bias value of the each rows or each columns of pixels. The specifically obtaining method describe above, here is not repeat again.

c. determining whether $V_{GK}-V_{t255}$ is smaller than $V_a$, and whether $V_{Gl}-V_{t0}$ is smaller than $V_b$, $V_a$ is a compensation reserve section between a predetermine outputting voltage max$V_{t255}$ which corresponding to maximum gray scale and the maximum value $V_{GK}$. $V_b$ is a compensation reserve section between a predetermine outputting voltage min$V_{t0}$ which corresponding to minimum gray scale and the minimum value $V_{Gl}$.

The problem would like be solved in this steps which is to determine whether the currently outputting voltage is smaller than the maximum value $V_{GK}$ and whether the currently outputting voltage is larger than the minimum value $V_{Gl}$ if the currently outputting voltage is larger than the range of the maximum value $V_{GK}$ and the minimum value $V_{Gl}$, outputting correspondingly regulating voltage value by the outputting voltage $V_t$.

d. if no, regulating currently maximum value of the potential regulator to $V_{GK}'=V_{t255}+V_a$ and regulating currently minimum value of the potential regulator to $V_{Gl}'=V_{t0}+V_b$.

If the currently outputting voltage is larger than the maximum value $V_{GK}$ or the minimum value $V_{Gl}$, which indicates the currently outputting voltage is over the regulation range of the potential regulator. Therefore, it needs to regulate the regulation range of the potential regulator. Wherein, if the currently outputting voltage is larger than the maximum value $V_{GK}$ such that the regulative currently maximum value of the potential regulator is $V_{GK}'=V_{t255}+V_a$; if the currently outputting voltage is smaller than the minimum value $V_{Gl}$ such that the regulative currently minimum value of the potential regulator is $V_{Gl}'=V_{t0}+V_b$.

Wherein, the currently the maximum value $V_{GK}'$ and the minimum value $V_{Gl}'$ are linearly regulating the outputting voltage of the regulation range of currently maximum value $V_{GK}'$ and currently minimum value $V_{Gl}'$. For example, it could obtains an outputting voltage of any gray scale image between gray scale 0 to 255 by the linearly regulation.

In this step, the potential regulator could be Gama IC, the controller could be TOCON board (central controlling board or logic board).

Comparing the existing technology, the above method of this present invention which could regulate the regulation range of the potential regulator. It made the outputting voltage which be compensated of the display panel is in the outputting voltage range of the potential regulator, such that could efficiency improve the problem of potential deviation in the display panel.

In other embodiment, the present invention further provided a potential regulation system of display panel.

Figure 2:
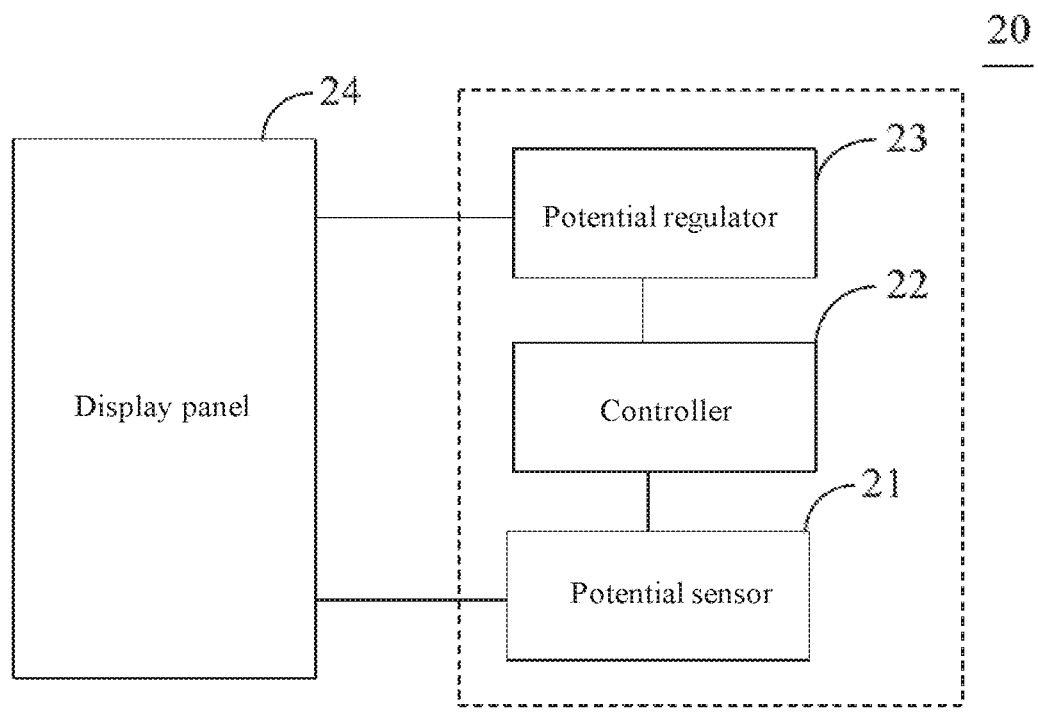
FIG. 2 is a structural schematic view of a potential regulation system of display panel according to an embodiment of the disclosure.

Please refer to FIG. 2. FIG. 2 is a structural schematic view of a potential regulation system of display panel according to an embodiment of the disclosure. The potential regulation system 20 is connecting to the display panel 24 for regulating outputting voltage of the display panel 24. Wherein, the potential regulation system 20 includes a potential sensor 21, a controller 22 and a potential regulator 23 which are coupled to each other. The potential sensor 21 sensing the display panel 24 for obtaining a display bias value $\Delta V_{th}$ of the display panel 24. The controller 22 is connecting to the potential sensor 21 for calculating an outputting voltage value $V_t=V_i+\Delta V_{th}$ which currently needs according a currently inputting voltage value $V_i$ and the display bias value $\Delta V_{th}$, and determining whether the currently inputting voltage value $V_i$ is in regulation range of the potential regulator; if yes, the controller 22 controlling the potential regulator 23 to output correspondingly regulation voltage value according to the outputting voltage value $V_t$; if no, the controller regulating the regulation range of the potential regulator 23 according to the outputting voltage value $V_t$. The potential sensor 21, the controller 22 and the potential regulator 23 are coupled to each other for achieving the method of potential regulation described above. Where in the potential regulator could be Gama IC, the controller could be TOCON board (central controlling board or logic board), the potential sensor 21 and the potential regulator 23 could be positioned on the controller 22.

Specifically, the potential sensor 21 obtaining a display bias value $\Delta V_{th}$ of the display panel 24, which according to the following process.

Comparing the display bias value $\Delta V_{th}$ of all pixels of the display panel 24, further obtaining the minimum display bias value $\Delta V_{th}$ of all pixels; or Comparing the display bias values $\Delta V_{th}$ of the each row pixels or the each column pixels on the display panel 24, further obtaining a minimum display bias value $\Delta V_{th}$ of the each row pixels or the each column pixels.

And then pre-setting a maximum value $V_{GK}$ and a minimum value $V_{Gl}$ for regulation voltage of the potential regulator 23, and calculating an outputting voltage value $V_{t255}=V_{i255}+\Delta V_{th}$ corresponding to a currently maximum gray scale, which according to currently input a voltage value $V_{i255}$ is corresponding to the maximum gray scale and the display bias values $\Delta V_{th}$, and calculating an outputting voltage value $V_{t0}=V_{i0}+\Delta V_{th}$ corresponding to a minimum gray scale currently, which according to currently input a voltage value $V_{i0}$ is corresponding to the minimum gray scale and the display bias values $\Delta V_{th}$. Further, the controller 22 determining whether $V_{GK}-V_{t255}$ is smaller than $V_a$, and whether $V_{Gl}-V_{t0}$ is smaller than $V_b$, $V_a$ is a compensation reserve section between a predetermine outputting voltage max$V_{t255}$ which corresponding to maximum gray scale and the maximum value $V_{GK}$, $V_b$ is a compensation reserve section between a predetermine outputting voltage min$V_{t0}$ which corresponding to minimum gray scale and the minimum value $V_{Gl}$;

if no, regulating currently maximum value of the potential regulator to $V_{GK}'=V_{t255}+V_a$ and regulating currently minimum value of the potential regulator to $V_{Gl}'=V_{t0}+V_b$.

Wherein, linearly regulating the outputting voltage of the regulation ranges of currently maximum value $V_{GK}'$ and currently minimum value $V_{Gl}'$ are according to the maximum value $V_{GK}'$ and currently minimum value $V_{Gl}'$. For example, it could obtains an outputting voltage of any gray scale image between gray scale 0 to 255 by the linearly regulation.

In the embodiment, it could calculate an outputting voltage value of the potential regulator 23 according to select the minimum display bias value from the each row pixels or the each column pixels on the display panel 24 or all pixels of the display panel 24. If select the minimum display bias value form the each row pixels or the each column pixels on the display panel 24, the controller 22 could control the potential regulator 23 for regulating the outputting voltage value of each row pixels or each column pixels according to the minimum display bias value thereof; If select the minimum display bias value form all pixels on the display panel 24, the controller 22 could control the potential regulator 23 for regulating the outputting voltage value of all pixels according to the minimum display bias value thereof.

In sum, the present invention provides a method of potential regulation for solving the problem of potential deviation after manufacturing the display panel.

The potential regulation system applied to display panel of this present invention, which the logic process is indicates by computer program and specifically achieves by display panel.

Figure 3:
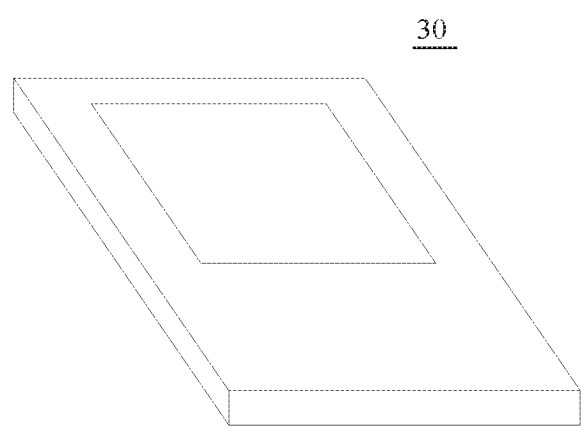
FIG. 3 is a structural schematic view of a storage apparatus according to an embodiment of the disclosure.

According to the computer program, which is achieves by software, and could be storage in a storage media which read in an electric device as an independently product for sales or uses. This is, the present invention further provides a storage apparatus for storage program data. The storage program data could be executed to achieve method of potential regulation above. Please refer to FIG. 3. FIG. 3 is a structural schematic view of a storage apparatus according to an embodiment of the disclosure. The storage apparatus 30 has a storage program data could be executed to achieve method of potential regulation of above embodiment, the storage apparatus 30 could be USB, CD, server and so on.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method of potential regulation of display panel, the display panel comprises a potential regulator for regulating display voltage of the display panel, the method comprising:
obtaining a display bias value $\Delta V_{th}$ of the display panel;
calculating an outputting voltage value $V_t=V_i+\Delta V_{th}$ which currently needs according a currently inputting voltage value $V_i$ and the display bias value $\Delta V_{th}$;
determining whether the currently inputting voltage value $V_i$ is in regulation range of the potential regulator;
if yes, controlling the potential regulator to output a correspondingly regulation voltage value according to the outputting voltage value $V_t$;
if no, regulating the regulation range of the potential regulator according to the outputting voltage value $V_t$;
wherein the display bias value $\Delta V_{th}$ comprises a display bias value of each row pixels or a display bias value of each column pixels, wherein the step of obtaining the display bias value $\Delta V_{th}$ of the display panel comprises:
comparing the display bias values $\Delta V_{th}$ of the each row pixels or the each column pixels on the display panel, further obtaining a minimum display bias value $\Delta V_{th}$ of the each row pixels or the each column pixels;
wherein the method further comprising:
pre-setting a maximum value $V_{GK}$ and a minimum value $V_{Gl}$ for regulation voltage of the potential regulator;
calculating a correspondingly outputting voltage value $V_{t255}=V_{i255}+\Delta V_{th}$ of a currently maximum gray scale by currently input a voltage value $V_{i255}$ which corresponding to the maximum gray scale and the display bias values $\Delta V_{th}$, and calculating a correspondingly outputting voltage value $V_{t0}=V_{i0}+\Delta V_{th}$ of a currently minimum gray scaleby currently input a voltage value $V_{i0}$ which corresponding to the minimum gray scale and the display bias values $\Delta V_{th}$;
determining whether $V_{GH}-V_{t255}$ is smaller than $V_a$, and whether $V_{G1}-V_{t0}$ is smaller than $V_b$, $V_a$ is a compensation reserve section between a predetermine outputting voltage max$V_{t255}$ which corresponding to maximum gray scale and the maximum value $V_{GK}$, $V_b$ is a compensation reserve section between a predetermine outputting voltage min$V_{t0}$ which corresponding to minimum gray scale and the minimum value $V_{Gl}$,
if no, regulating currently maximum value of the potential regulator to $V_{GK}'=V_{t255}\pm V_a$ and regulating currently minimum value of the potential regulator to $V_{Gl}'=V_{t0}+V_b$.

2. The method of potential regulation of display panel according to claim 1, wherein the display bias value $\Delta V_{th}$ includes display bias values of all pixels, wherein the step of obtaining the display bias value $\Delta V_{th}$ of the display panel comprises:
comparing all display bias values $\Delta V_{th}$ of all pixels on the display panel, further obtaining a minimum display bias value $\Delta V_{th}$ of all pixels.

3. The method of potential regulation of display panel according to claim 1, wherein the method further comprising:
linearly regulating the outputting voltage of the regulation range of currently maximum value $V_{GK}'$ and currently minimum value $V_{Gl}'$ according to the maximum value $V_{GK}'$ and currently minimum value $V_{Gl}'$.

4. A potential regulation system of display panel, the potential regulation system comprising a potential sensor, a controller and a potential regulator coupled to each other, wherein:
the potential sensor obtaining a display bias value $\Delta V_{th}$ of the display panel;
the controller calculating an outputting voltage value $V_t=V_i+\Delta V_{th}$ which currently needs according a currently inputting voltage value $V_i$ and the display bias value $\Delta V_{th}$, and determining whether the currently inputting voltage value $V_i$ is in regulation range of the potential regulator;
if yes, the controller controlling the potential regulator to output a correspondingly regulation voltage value according to the outputting voltage value $V_t$;
if no, the controller regulating the regulation range of the potential regulator according to the outputting voltage value $V_t$;
wherein the potential sensor obtaining the display bias value $\Delta V_{th}$ of the display panel comprises:
comparing all display bias values $\Delta V_{th}$ of all pixels on the display panel, further obtaining a minimum display bias value $\Delta V_{th}$ of all pixels; or
comparing the display bias values $\Delta V_{th}$ of the each row pixels or the each column pixels on the display panel, further obtaining a minimum display bias value $\Delta V_{th}$ of the each row pixels or the each column pixels;
wherein, pre-setting a maximum value $V_{GK}$ and a minimum value $V_{Gl}$ for regulation voltage of the potential regulator, and calculating a correspondingly outputting voltage value $V_{t255}=V_{i255}\pm\Delta V_{th}$ of a currently maximum gray scale by currently input a voltage value $V_{i255}$ which corresponding to the maximum gray scale and the display bias values $\Delta V_{th}$, and calculating a correspondingly outputting voltage value $V_{t0}=V_{i0}+\Delta V_{th}$ of a currently minimum gray scaleby currently input a voltage value $V_{i0}$ which corresponding to the minimum gray scale and the display bias values $\Delta V_{th}$, further determining whether $V_{GK}-V_{t155}$ is smaller than $V_a$, and whether $V_{Gl}-V_{t0}$ is smaller than $V_b$, $V_a$ is a compensation reserve section between a predetermine outputting voltage $maxV_{t255}$ which corresponding to maximum gray scale and the maximum value $V_{GK}$, $V_b$ is a compensation reserve section between a predetermine outputting voltage $minV_{t0}$ which corresponding to minimum gray scale and the minimum value $V_{Gl}$;

if no, regulating currently maximum value of the potential regulator to $V_{GK}'=V_{t255}\pm V_a$ and regulating currently minimum value of the potential regulator to $V_{Gl}'=V_{t0}+V_b$.

5. The potential regulation system of display panel according to claim 4, wherein the method further comprising:

linearly regulating the outputting voltage of the regulation range of currently maximum value $V_{GK}'$ and currently minimum value $V_{Gl}'$ according to the maximum value $V_{GK}'$ and currently minimum value $V_{Gl}'$.

6. A storage apparatus, the storage apparatus for storage program data, the storage program data executed to achieve method of potential regulation of display panel, the display panel comprising a potential regulator for regulating display voltage of display panel, wherein the method of potential regulation comprising:

obtaining a display bias value $\Delta V_{th}$ of the display panel;

calculating an outputting voltage value $V_t=V_i+\Delta V_{th}$ which currently needs according a currently inputting voltage value $V_i$ and the display bias value $\Delta V_{th}$;

determining whether the currently inputting voltage value $V_i$ is in regulation range of the potential regulator;

if yes, controlling the potential regulator to output a correspondingly regulation voltage value according to the outputting voltage value $V_t$;

if no, regulating the regulation range of the potential regulator according to the outputting voltage value $V_t$;

wherein the display bias value $\Delta V_{th}$ further includes a display bias value of each row pixels or a display bias value of each column pixels, wherein the step of obtaining the display bias value $\Delta V_{th}$ of the display panel comprises:

comparing the display bias values $\Delta V_{th}$ of the each row pixels or the each column pixels on the display panel, further obtaining a minimum display bias value $\Delta V_{th}$ of the each row pixels or the each column pixels;

wherein the method further comprising:

pre-setting a maximum value $V_{GK}$ and a minimum value $V_{Gl}$ for regulation voltage of the potential regulator;

calculating a correspondingly outputting voltage value $V_{t255}=V_{i255}+\Delta V_{th}$ of a currently maximum gray scale by currently input a voltage value $V_{i255}$ which corresponding to the maximum gray scale and the display bias values $\Delta V_{th}$, and calculating a correspondingly outputting voltage value $V_{t0}=V_{i0}+\Delta V_{th}$ of a currently minimum gray scaleby currently input a voltage value $V_{i0}$ which corresponding to the minimum gray scale and the display bias values $\Delta V_{th}$;

determining whether $V_{GK}-V_{t255}$ is smaller than $V_a$, and whether $V_{Gl}-V_{t0}$ is smaller than $V_b$, $V_a$ is a compensation reserve section between a predetermine outputting voltage $maxV_{t255}$ which corresponding to maximum gray scale and the maximum value $V_{GK}$, $V_b$ is a compensation reserve section between a predetermine outputting voltage $minV_{t0}$ which corresponding to minimum gray scale and the minimum value $V_{Gl}$;

if no, regulating currently maximum value of the potential regulator to $V_{GK}=V_{t255}+V_a$ and regulating currently minimum value of the potential regulator to $V_{Gl}'=V_{t0}+V_b$.

7. The storage apparatus according to claim 6, wherein the display bias value $\Delta V_{th}$ includes display bias values of all pixels, wherein the step of obtaining the display bias value $\Delta V_{th}$ of the display panel comprises:

comparing all display bias values $\Delta V_{th}$ of all pixels on the display panel, further obtaining a minimum display bias value $\Delta V_{th}$ of all pixels.

8. The storage apparatus according to claim 6, wherein the method further comprising:

linearly regulating the outputting voltage of the regulation range of currently maximum value $V_{GK}'$ and currently minimum value $V_{Gl}'$ according to the maximum value $V_{GK}'$ and currently minimum value $V_{Gl}'$.

* * * * *